United States Patent
Gu et al.

(10) Patent No.: US 11,395,415 B2
(45) Date of Patent: Jul. 19, 2022

(54) DISPLAY DEVICE WITH HINGE STRUCTURE

(71) Applicant: BOE TECHNOLOGY GROUP CO., LTD., Beijing (CN)

(72) Inventors: Penghao Gu, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/911,683

(22) Filed: Jun. 25, 2020

(65) Prior Publication Data
US 2021/0007229 A1    Jan. 7, 2021

(30) Foreign Application Priority Data
Jul. 4, 2019 (CN) .......................... 201910599258.0

(51) Int. Cl.
    H05K 5/00 (2006.01)
    H05K 5/02 (2006.01)
(52) U.S. Cl.
    CPC ......... H05K 5/0017 (2013.01); H05K 5/0226 (2013.01)
(58) Field of Classification Search
    CPC ........................... H05K 5/0017; H05K 5/0226
    See application file for complete search history.

(56) References Cited

U.S. PATENT DOCUMENTS

| | | | | |
|---|---|---|---|---|
| 10,019,036 B2* | 7/2018 | Sun | .......... | G06F 1/1652 |
| 10,345,856 B2* | 7/2019 | Song | .......... | G09G 3/34 |
| 11,099,608 B2* | 8/2021 | Kim | .......... | G09F 9/301 |
| 2012/0307472 A1 | 12/2012 | Bohn et al. | | |
| 2017/0285688 A1 | 10/2017 | Sun | | |
| 2018/0107250 A1* | 4/2018 | Cho | .......... | G09F 9/301 |
| 2018/0150108 A1 | 5/2018 | Song | | |
| 2018/0192527 A1* | 7/2018 | Yun | .......... | G06F 1/1652 |
| 2019/0090364 A1* | 3/2019 | Shin | .......... | G09F 9/301 |

(Continued)

FOREIGN PATENT DOCUMENTS

| | | |
|---|---|---|
| CN | 104714699 A | 6/2015 |
| CN | 105516409 A | 4/2016 |

(Continued)

OTHER PUBLICATIONS

First Office Action for Chinese Application No. 201910599258.0, dated Jan. 29, 2021, 8 Pages.

*Primary Examiner* — Rockshana D Chowdhury
*Assistant Examiner* — Douglas R Burtner
(74) *Attorney, Agent, or Firm* — Brooks Kushman P.C.

(57) ABSTRACT

Provided is a display device, including a body structure, a flexible display panel arranged on the body structure, a primary adhesive layer, and an elastic connection structure, wherein the body structure comprises at least two unfoldable portions and a first foldable portion between the two adjacent unfoldable portions, and the first foldable portion comprises a hinge structure. The primary adhesive layer is arranged between the flexible display panel and the unfoldable portions, and the elastic connection structure is arranged between the body structure and the flexible display panel, and the elastic connection structure is configured to enable a second foldable portion of the flexible display panel to be switched between a folded state and a flattened state.

12 Claims, 6 Drawing Sheets

(56) References Cited

U.S. PATENT DOCUMENTS

| | | | |
|---|---|---|---|
| 2019/0143638 A1* | 5/2019 | Park | B32B 7/025 |
| | | | 361/820 |
| 2019/0174640 A1 | 6/2019 | Park et al. | |
| 2019/0380217 A1* | 12/2019 | Cosgrove | H05K 5/0226 |
| 2020/0068725 A1* | 2/2020 | Park | H01L 51/5237 |
| 2020/0313111 A1* | 10/2020 | Kim | H05K 7/20954 |
| 2020/0344897 A1* | 10/2020 | Kim | G06F 1/1652 |
| 2021/0397218 A1* | 12/2021 | Seo | G06F 1/1641 |
| 2022/0011814 A1* | 1/2022 | Ryou | G06F 1/1652 |

FOREIGN PATENT DOCUMENTS

| | | |
|---|---|---|
| CN | 106297568 A | 1/2017 |
| CN | 108122502 A | 6/2018 |

* cited by examiner

DISPLAY DEVICE WITH HINGE STRUCTURE

CROSS-REFERENCE TO RELATED APPLICATION

This application claims priority to Chinese Patent Application No. 201910599258.0 filed on Jul. 4, 2019, which is incorporated herein by reference in its entirety.

TECHNICAL FIELD

The present disclosure relates to the manufacture of a display product, in particular to a display device.

BACKGROUND

As a first choice of a screen, an Organic Light-Emitting Diode (OLED) display device has such advantages as self-luminescence, high light efficiency, rapid response, high resolution and high contrast, and meanwhile it is able to provide the screen with certain flexibility and adaptability. Along with the development of a flexible display panel, expectations for a foldable display product are rising.

For the display in a folded state, folding and unfolding actions are performed at a bending region, so it is necessary to provide an entire machine with a movable mechanism, e.g., a hinge, at the bending region. The entire machine is provided with a flat region and a movable hinge region, and the folding and unfolding actions are achieved through the hinge. Then, the screen needs to be adhered to the entire machine through a soft adhesive having strong viscosity, so as to enable the entire machine to be in a flattened state after the screen has been folded, thereby to enable the screen to be in a flattened state through the adhesive. A hinge structure is provided with uneven regions such as a groove, and there is a gap between the groove of the hinge structure and an adhesive layer. When the folding and unfolding actions are performed repeatedly, the adhesive layer is squeezed and easily deformed, so the adhesive may move into the groove and thereby lose its shape restoration capability, leading to an energy loss, a decrease in the viscosity, a fracture failure for the adhesive layer, and the like. In addition, when the adhesive layer at the bending region has lost its effect, it is impossible to flatten, through an external force applied by the adhesive layer, the screen with a bulge at the bending region.

SUMMARY

To solve the above problems, the present disclosure provides in some embodiments a display device, including a body structure, a flexible display panel arranged on the body structure, a primary adhesive layer, and an elastic connection structure, wherein the body structure includes at least two unfoldable portions and a first foldable portion between the two adjacent unfoldable portions, and the first foldable portion includes a hinge structure; the primary adhesive layer is arranged between the flexible display panel and the unfoldable portions, and the elastic connection structure is arranged between the body structure and the flexible display panel, and the elastic connection structure is configured to enable a second foldable portion of the flexible display panel to be switched between a folded state and a flattened state.

In a possible embodiment of the present disclosure, in the flattened state, an orthogonal projection of the hinge structure onto a surface of the flexible display panel distal to the hinge structure falls within an orthogonal projection of the second foldable portion onto the surface of the flexible display panel distal to the hinge structure.

In a possible embodiment of the present disclosure, the hinge structure includes a plurality of convex portions and a plurality of concave portions arranged alternately, the elastic connection structure includes a first adhesive layer arranged between the convex portion and the second foldable portion, and a thickness of the first adhesive layer is identical to a thickness of the primary adhesive layer.

In a possible embodiment of the present disclosure a material of the first adhesive layer is identical to a material of the primary adhesive layer.

In a possible embodiment of the present disclosure, a surface of the first adhesive layer distal to the body structure is flush with a surface of the primary adhesive layer distal to the body structure, and a surface of the first adhesive layer distal to the flexible display panel is flush with a surface of the primary adhesive layer distal to the flexible display panel.

In a possible embodiment of the present disclosure, the hinge structure includes a plurality of convex portions and a plurality of concave portions arranged alternately, wherein the elastic connection structure includes: a first adhesive layer arranged between the convex portion and the second foldable portion, wherein a thickness of the first adhesive layer is identical to a thickness of the primary adhesive layer; a second adhesive layer arranged between the concave portion and the second foldable portion, wherein a thickness of the second adhesive layer is identical to a thickness of the primary adhesive layer; and a first elastic filler filled in the concave portion.

In a possible embodiment of the present disclosure, the first adhesive layer, the second adhesive layer and the primary adhesive layer are made of a same material.

In a possible embodiment of the present disclosure, the first adhesive layer, the second adhesive layer and the primary adhesive layer are made of an optical acrylic adhesive.

In a possible embodiment of the present disclosure, a surface of the first adhesive layer distal to the body structure, a surface of the second adhesive layer distal to the body structure and a surface of the primary adhesive layer distal to the body structure are flush with each other, and a surface of the first adhesive layer distal to the flexible display panel, a surface of the second adhesive layer distal to the flexible display panel and a surface of the primary adhesive layer distal to the flexible display panel are flush with each other.

In a possible embodiment of the present disclosure, the first elastic filler is made of thermoplastic polyurethane rubber.

In a possible embodiment of the present disclosure, the hinge structure includes a plurality of convex portions and a plurality of concave portions arranged alternately, wherein the elastic connection structure includes: a first adhesive layer arranged between the convex portion and the flexible display panel, wherein a thickness of the first adhesive layer is identical to a thickness of the primary adhesive layer; a second adhesive layer arranged between the concave portion and the second foldable portion, wherein a thickness of the second adhesive layer is identical to a thickness of the primary adhesive layer; and a flat connection layer arranged at a side of each of the primary adhesive layer, the first adhesive layer and the second adhesive layer distal to the flexible display panel, wherein the flat connection layer includes a second elastic filler extending toward the hinge structure and filled in the concave portion.

In a possible embodiment of the present disclosure, the first adhesive layer, the second adhesive layer and the primary adhesive layer are made of a same material.

In a possible embodiment of the present disclosure, the first adhesive layer, the second adhesive layer and the primary adhesive layer are made of an optical acrylic adhesive.

In a possible embodiment of the present disclosure, a surface of the first adhesive layer distal to the body structure, a surface of the second adhesive layer distal to the body structure and a surface of the primary adhesive layer distal to the body structure are flush with each other, and a surface of the first adhesive layer distal to the flexible display panel, a surface of the second adhesive layer distal to the flexible display panel and a surface of the primary adhesive layer distal to the flexible display panel are flush with each other.

In a possible embodiment of the present disclosure, the flat connection layer is formed integrally with the second elastic filler.

In a possible embodiment of the present disclosure, the flat connection layer and the second elastic filler are made of thermoplastic polyurethane rubber.

In a possible embodiment of the present disclosure, a support layer is further arranged on a surface of the flexible display panel proximate to the body structure, and the primary adhesive layer and the elastic connection structure are arranged on the support layer.

In a possible embodiment of the present disclosure, a touch layer is further arranged on a surface of the flexible display panel distal to the body structure.

In a possible embodiment of the present disclosure, in the folded state, a surface of the second foldable portion distal to the hinge structure is a curved surface, and in the flattened state, the surface of the second foldable portion distal to the hinge structure is a flat surface.

In a possible embodiment of the present disclosure, the primary adhesive layer is a sealant.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
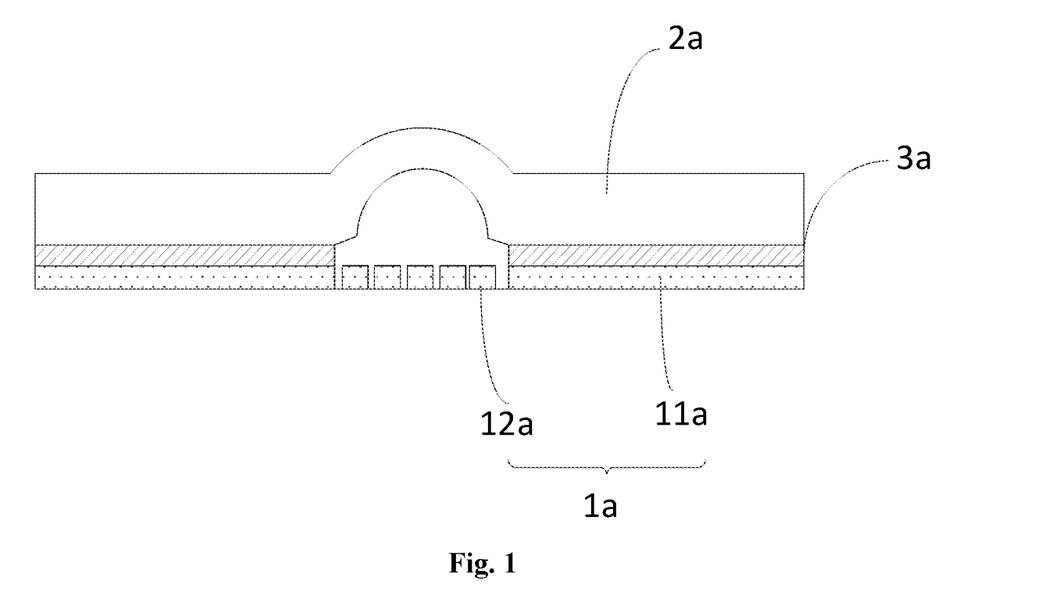
FIG. 1 is a schematic view showing the deformation of a flexible display panel in related art.
Figure 2:
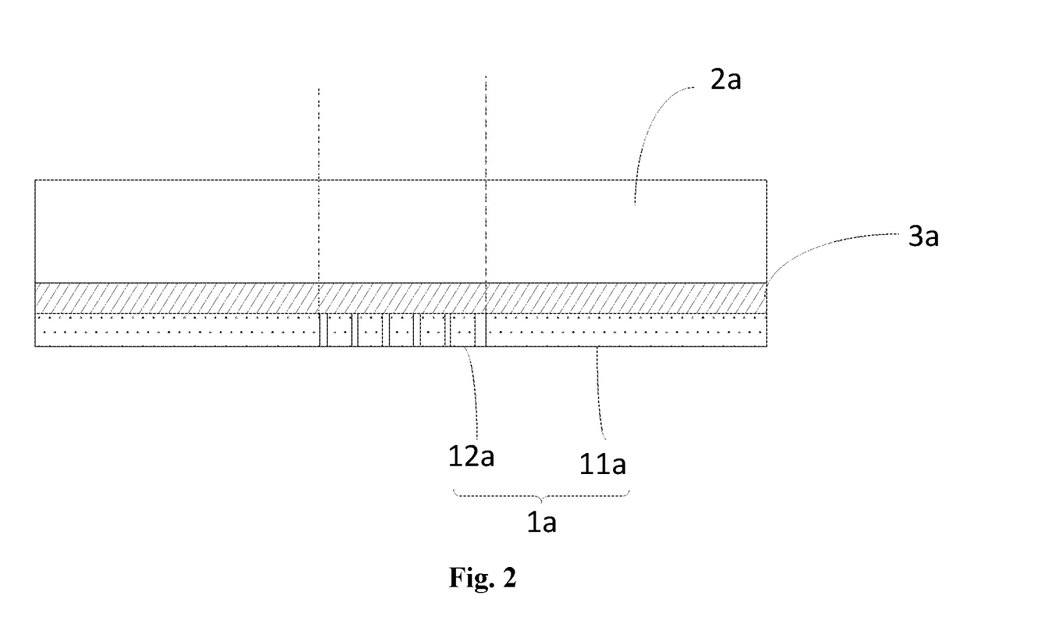
FIG. 2 is a schematic view showing a display device in the related art.
Figure 3:
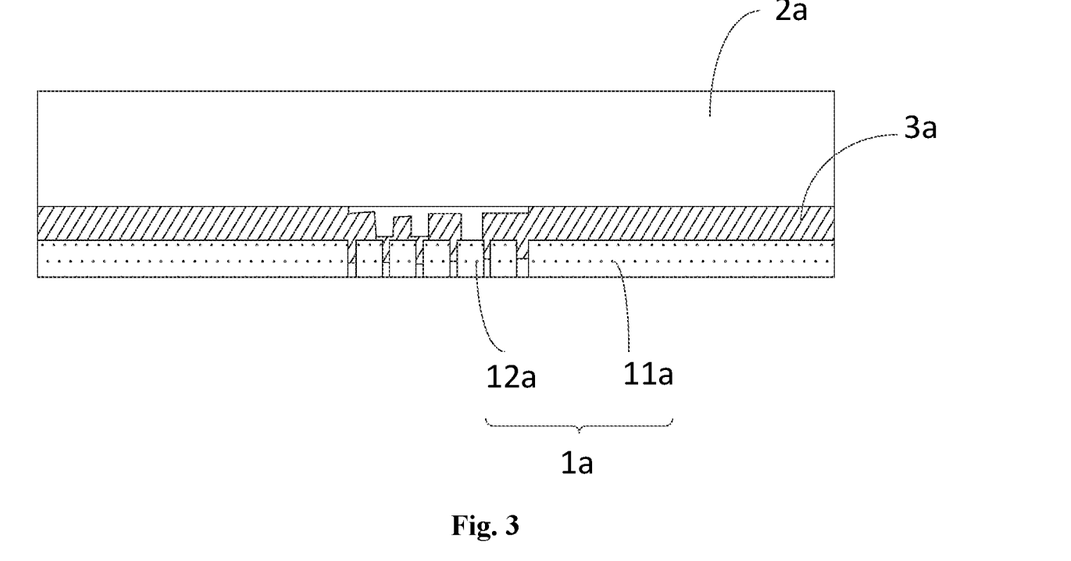
FIG. 3 is a schematic view showing the deformation of an adhesive layer in the display device in FIG. 2 when the adhesive layer has been squeezed.

In the related art, as shown in FIGS. 1 to 3, for a foldable display panel, folding and unfolding actions are performed by a first foldable portion, so it is necessary to provide an entire machine with a movable mechanism, e.g., a hinge, at the first foldable portion. The entire machine 1*a* is provided with a flat region 11*a* and a movable hinge region 12*a*, and the folding and unfolding actions are achieved at the movable hinge region 12*a*. Then, a screen 2*a* needs to be adhered to the entire machine through a soft adhesive layer 3*a* having strong viscosity, so as to enable the entire machine 1*a* to be in an unfolded state after the screen 2*a* has been folded, thereby to enable the screen 2*a* in a flattened state through the adhesive layer 3*a*.

Currently, the adhesive layer 3*a* for adhering the screen 2*a* to the entire machine 1*a* is usually a surface-like adhesive. To be specific, the adhesive layer 3*a* of a display device has the following two structures.

In a first structure, the surface-like adhesive is adopted at the unfoldable flat region, and a hollowed-out adhesive-free design is adopted at the foldable and movable hinge region. However, there are some defects for this design. For example, at the flat region, a bottom of the screen 2*a* is not supported, so it may be easily damaged due to collision. In addition, due to creases occurring after the screen has been folded, it is impossible to restore the adhesive layer to its original flat shape through the entire machine, so it is impossible to flatten the screen 2*a*. FIG. 1 shows the deformation of the foldable portion of the screen 2*a*.

In a second structure, the surface-like adhesive is adopted at each of the unfoldable flat region and the foldable and movable hinge region, i.e., the adhesive layer 3*a* covers the entire movable hinge region 12*a*. However, the hinge region 12*a* is provided with uneven regions such as a groove, so there is a gap between the groove at the hinge region 12*a* and the adhesive layer 3*a*, as shown in FIG. 2, where a portion of the screen 2*a* between the dotted lines is just the foldable portion of the screen 2*a*. When the screen 2*a* is folded, the adhesive layer is easily deformed due to squeezing, so the surface-like adhesive may move into the groove at the hinge region 12*a* and thereby lose its shape restoration capability, leading to an energy loss, a decrease in the viscosity and a fracture failure for the adhesive layer 3*a*. In addition, when the adhesive layer 3a on the foldable portion has lost its effect, it is impossible to adhere the screen 2a to the entire machine through the adhesive layer, and thereby it is impossible to flatten the screen 2a through the adhesive layer. FIG. 3 shows the adhesive layer 3a which is broken and deformed.

Figure 5:
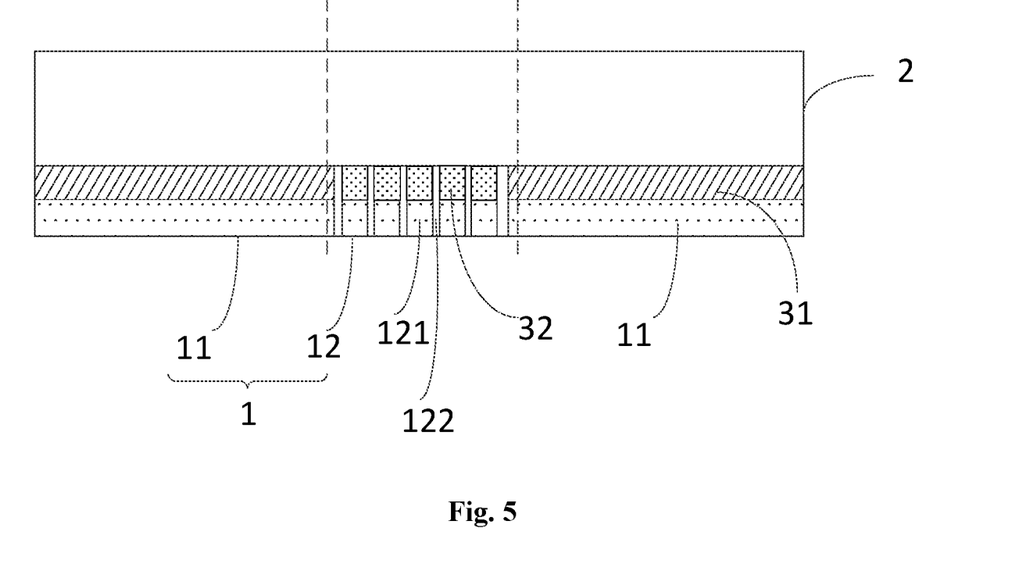
FIG. 5 is another schematic view showing the display device according to some embodiments of the present disclosure.

To solve the above problems, the present disclosure provides in some embodiments a display device which, as shown in FIG. 5 for example, includes a body structure 1 and a flexible display panel 2 arranged on the body structure 1. The body structure 1 includes at least two unfoldable portions 11 and a first foldable portion 12 between two adjacent unfoldable portions 11, and the first foldable portion 12 includes a hinge structure.

A sealant 31 may be arranged between the flexible display panel 2 and each unfoldable portion 11. An elastic connection structure may be arranged between the body structure 1 and the flexible display panel 2 and configured to enable a second foldable portion of the flexible display panel 2 corresponding to the hinge structure (a portion of the flexible display panel 2 between two dotted lines in FIG. 5 is just the second foldable portion) to be switched between a folded state and a flattened state. In the folded state, a surface of the second foldable portion distal to the hinge structure (i.e., a part of a display surface of the flexible display panel) may be a curved surface, so the display surface of the flexible display panel 2 may be in a curved state. In the flattened state, the surface of the second foldable portion distal to the hinge structure may be a flat surface, so the display surface of the flexible display panel 2 may be in a flattened state as a whole.

In the embodiments of the present disclosure, different from an integral-type connection mode (or a connection mode without any adhesive layer at a region corresponding to the hinge structure) between the flexible display panel 2 and the body structure 1, the flexible display panel 2 may be connected to the body structure 1 in a split-type connection mode depending on different regions of the body structure 1. To be specific, each unfoldable portion 11 may be adhered to the flexible display panel 2 through the sealant 31 (i.e., through the surface-like adhesive), and the hinge structure between two adjacent unfoldable portions 11 may be connected to the flexible display panel 2 through the elastic connection structure. Through the elastic connection structure, as compared with the connection mode without any adhesive layer at the region corresponding to the hinge structure, it is able to apply a good connection force between the hinge structure and the flexible display panel 2, and flatten the flexible display panel 2 when the display device is switched from the folded state to the flattened state, thereby to prevent the occurrence of deformation. In addition, as compared with the connection mode where the adhesive layer is applied as a whole, it is able to prevent the adhesive layer from moving into a concave portion of the hinge structure when the adhesive layer is deformed due to squeezing, and prevent an adhesion effect of the adhesive from being adversely affected, thereby to solve the problem in the related art that it is impossible to restore the flexible display panel 2 into the flattened state due to a decrease in the adhesion between the broken or deformed adhesive layer and the flexible display panel 2 when the display device is switched from the folded state to the flattened state. In other words, through the elastic connection structure, it is able to prevent the deformation of the second foldable portion of the flexible display panel 2 (i.e., the portion of the flexible display panel 2 between the two dotted lines in FIG. 5) from being unrestorable when the flexible display panel needs to be switched from the folded state to the flattened state. In addition, with respect to the connection at the region corresponding to the hinge structure, the elastic connection structure may be patterned or the groove may be filled up, so as to flatten a bulge generated at the second foldable portion of the flexible display panel corresponding to the hinge structure in a better manner when the flexible display panel is switched between the folded state and the flattened state repeatedly, thereby to prevent the second foldable portion from being separated from the hinge structure. In other words, through the elastic connection structure, it is able to switch the second foldable portion of the flexible display panel 2 freely between the folded state and the flattened state i.e., freely fold and unfold the second foldable portion, thereby to solve the problem that the flexible display panel 2 is incapable of being well flattened due to the unrestorable deformation of the second foldable portion.

Hence, through the elastic connection structure, it is able to apply the good connection force between the hinge structure and the flexible display panel, and flatten the second foldable portion of the flexible display panel corresponding to the hinge structure when the flexible display panel is switched from the folded state to the flattened state, thereby to prevent the occurrence of the unrestorable deformation or large creases and achieve a better flattening effect.

The elastic connection structure may be of various structures, and some of them will be described hereinafter.

Figure 4:
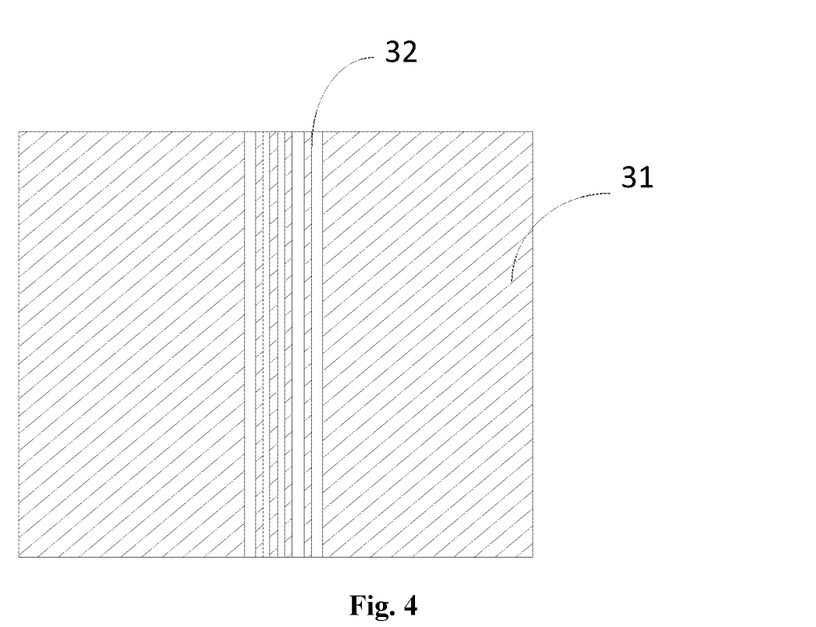
FIG. 4 is a schematic view showing a display device according to some embodiments of the present disclosure.

In some embodiments of the present disclosure, as shown in FIGS. 4 and 5, the hinge structure 12 may include a plurality of convex portions 121 and a plurality of concave portions 122 arranged alternately, the elastic connection structure may include a first adhesive layer 32 arranged between each convex portion 121 and the flexible display panel 2, and the first adhesive layer 32 may have a thickness identical to the sealant 31.

In the embodiments of the present disclosure, the first adhesive layer may be merely arranged between each convex portion 121 and the flexible display panel 2, rather than between each concave portion 122 and the flexible display panel 2. As a result, it is able to flatten the second foldable portion of the flexible display panel 2 corresponding to the hinge structure under the effect of an adhesion force of the first adhesive layer 32 when the display device is switched from the folded state to the flattened state, thereby to achieve a better flattening effect for the flexible display panel 2. In addition, no adhesive layer is arranged in each concave portion 122, which is able to prevent the adhesive layer from moving into the concave portion 122 when the adhesive layer is squeezed and deformed. In other words, two adjacent first adhesive layers 32 may be independent and separated from each other. As compared with the adhesive layer in FIG. 2, it is able to prevent the state switching of the flexible display panel 2 from being adversely affected when the first adhesive layer 32 is stretched and deformed.

In the embodiments of the present disclosure, the first adhesive layer 32 may be made of, but not limited to, a material identical to the sealant 31, so as to facilitate the manufacture. The material of the first adhesive layer 32 may alternatively be different from that of the sealant 31. In addition, the first adhesive layer 32 may be flush with the sealant 31.

Figure 6:
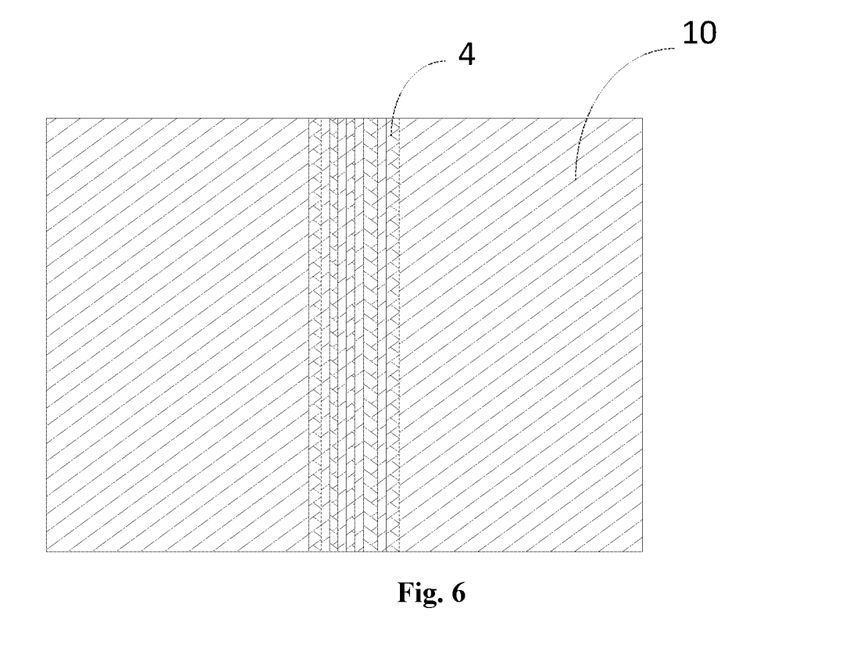
FIG. 6 is yet another schematic view showing the display device according to some embodiments of the present disclosure.
Figure 7:
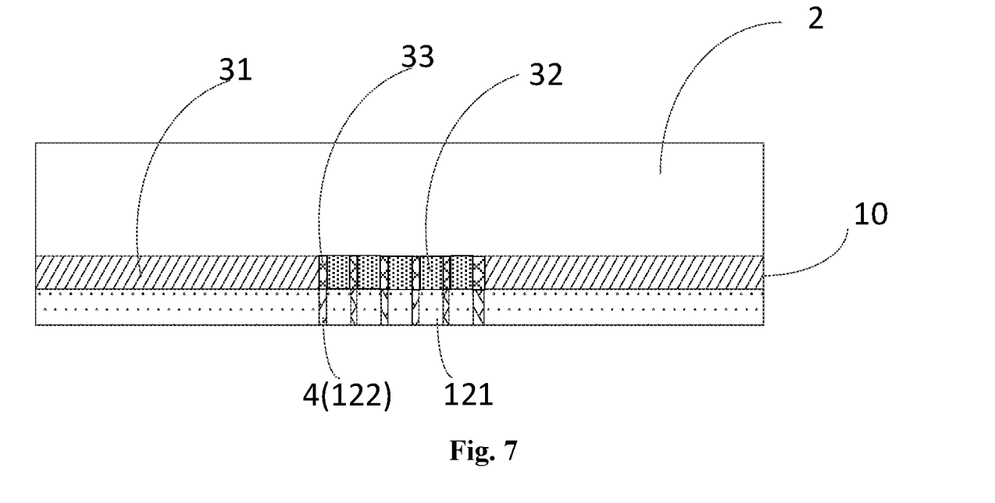
FIG. 7 is still yet another schematic view showing the display device according to some embodiments of the present disclosure.
Figure 8:
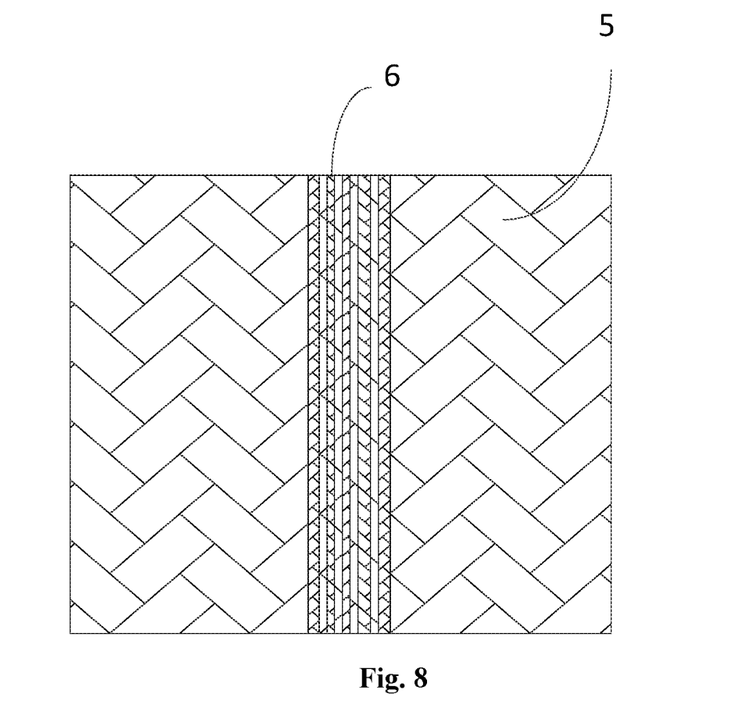
FIG. 8 is still yet another schematic view showing the display device according to some embodiments of the present disclosure.

In some embodiments of the present disclosure, as shown in FIGS. 6 and 7, the hinge structure 12 may include a plurality of convex portions 121 and a plurality of concave portions 122 arranged alternately. The elastic connection structure may include: a first adhesive layer 32 arranged between each convex portion 121 and the flexible display panel 2, the first adhesive layer 32 having a thickness identical to the sealant 31; a second adhesive layer 33 arranged on the flexible display panel at a position corresponding to each concave portion 122, the second adhesive layer 33 having a thickness identical to the sealant 31; and a first elastic filler 4 made of an elastic material and arranged in each concave portion 122.

In the embodiments of the present disclosure, through the first adhesive layer 32 and the second adhesive layer 33, it is able to apply a sufficient adhesion force to the flexible display panel. In addition, the elastic material (i.e., the first elastic filler 4) may be filled in the grooves of the hinge structure in advance, so as to prevent the second adhesive layer 33 from being filled into the concave portion and deformed, thereby to further prevent the second adhesive layer 33 from being broken. As a result, it is able to flatten the flexible display panel in a better manner when the display device is switched from the folded state to the flattened state. Moreover, through the first elastic filler 4, it is able to flatten the region corresponding to the hinge structure, thereby to prevent the adhesive layer from being separated from the flexible display panel caused by the deformation of the adhesive layer when the adhesive layer is filled into the concave portion or stretched repeatedly.

In the embodiments of the present disclosure, the second adhesive layer 33 may be arranged on the flexible display panel at a position corresponding to each concave portion 122, i.e., an orthogonal projection of the second adhesive layer 33 onto the flexible display panel 2 may completely fall within an orthogonal projection of the corresponding concave portion 122 onto the flexible display panel 2.

In the embodiments of the present disclosure, the first adhesive layer 32, the second adhesive layer 33 and the sealant may be formed integrally, and made of a same material or different materials. As shown in FIG. 7, an adhesive layer 10 may include the sealant 31, the first adhesive layer 32 and the second adhesive layer 33 which may be in flush with each other.

In the embodiments of the present disclosure, the first elastic filler 4 may be made of thermoplastic polyurethane (TPU) rubber.

In the embodiments of the present disclosure, the TPU rubber which is easily deformable and has relatively strong adhesion with the hinge structure may be filled into each concave portion 122 to form the first elastic filler 4, so it is able to prevent the folding action of the display device from being adversely and prevent the second adhesive layer 33 from moving into the concave portion 122, thereby to flatten the flexible display panel 2 in a better manner.

In the embodiments of the present disclosure, the first elastic filler 4 may be formed through a hot-pressing process. To be specific, a preform may be prepared through a hot-pressing process using a hot roller or hot plate, softened at a temperature of 120° C. to 180° C., and then hot-pressed at a temperature of 120° C. for 60 s using a predetermined mold to acquire the first elastic filler 4 with a predetermined shape.

In some embodiments of the present disclosure, as shown in FIGS. 8 to 12, the hinge structure may include a plurality of convex portions 121 and a plurality of concave portions 122 arranged alternately. The elastic connection structure may include: a first adhesive layer 32 arranged between the convex portion 121 and the flexible display panel 2, the first adhesive layer 32 having a thickness identical to the sealant 31; a second adhesive layer 33 arranged on the flexible display panel at a position corresponding to the concave portion 122, the second adhesive layer 33 having a thickness identical to the sealant; and a flat connection layer 5 arranged at a side of each of the sealant 31, the first adhesive layer 32 and the second adhesive layer 33 distal to the flexible display panel, wherein the flat connection layer 5 includes a second elastic filler 6 extending toward the hinge structure and arranged in each concave portion 122.

In the embodiments of the present disclosure, the second adhesive layer 33 may be arranged on the flexible display panel at a position corresponding to the concave portion 122, i.e., an orthogonal projection of the second adhesive layer 33 onto the flexible display panel 2 may completely fall within an orthogonal projection of the corresponding concave portion 122 onto the flexible display panel 2.

Figure 10:
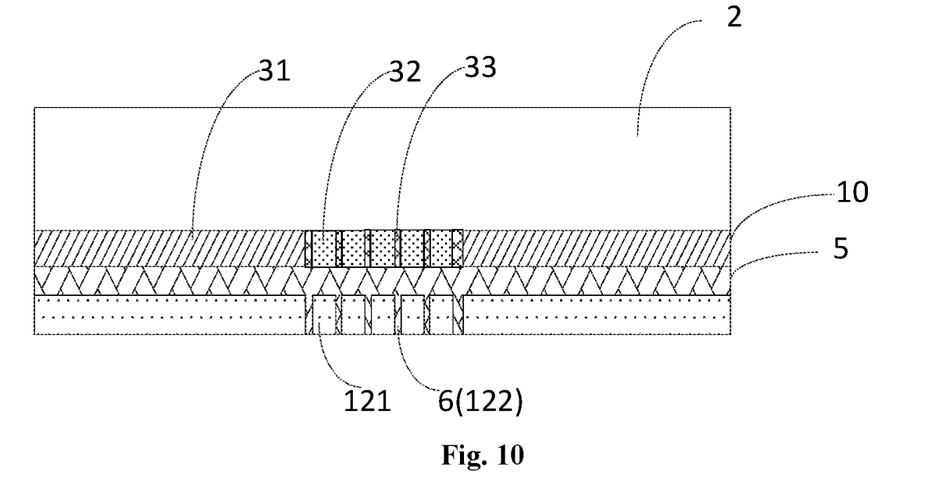
FIG. 10 is still yet another schematic view showing the display device according to some embodiments of the present disclosure.

In the embodiments of the present disclosure, the first adhesive layer 32, the second adhesive layer 33 and the sealant 31 may be formed integrally, and made of a same material or different materials. As shown in FIG. 10, the adhesive layer 10 may include the sealant 31, the first adhesive layer 32 and the second adhesive layer 33, which are flush with each other.

Figure 11:
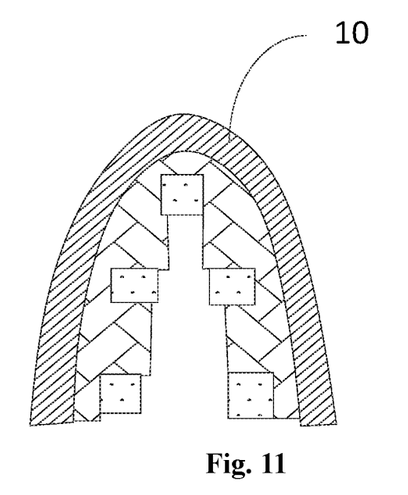
FIG. 11 is a schematic view showing the display device in a folded state according to some embodiments of the present disclosure.
Figure 12:
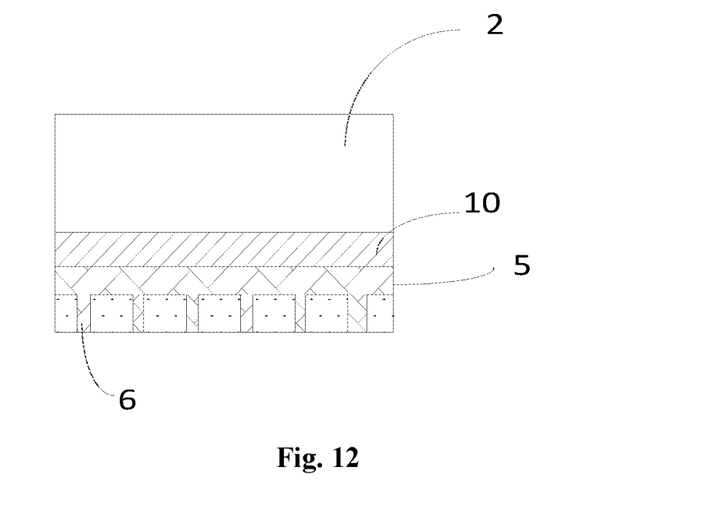
FIG. 12 is a schematic view showing the display device in a flattened state according to some embodiments of the present disclosure.

As compared with the embodiment of FIGS. 6 and 7, in this embodiment of the present disclosure, the flat connection layer 5 is added. The first adhesive layer 32, the second adhesive layer 33 and the sealant 31 may be formed integrally and cover the whole flexible display panel 2. Through the adhesive layer 10 (including the sealant, the first adhesive layer 32 and the second adhesive layer 33) at a back surface of the flexible display panel 2 as a whole, it is able to provide the adhesion in a better manner, and flatten the bulge of the second foldable portion of the flexible display panel 2 generated in the folded state when the display device is switched from the folded state to the flattened state. Through the flat connection layer 5 and the second elastic filler 6, it is able to prevent the adhesive layer from moving into the concave portions or being broken, thereby to provide the adhesion in a better manner. In addition, the TPU rubber may provide excellent buffering and shock-resistant performance. FIG. 11 shows the display device in the folded state and FIG. 12 shows the display device in the flattened state. In FIGS. 11 and 12, the sealant 31, the first adhesive layer 32 and the second adhesive layer 33 may be made of a same material and formed integrally to obtain the adhesive layer 10.

In the embodiments of the present disclosure, the flat connection layer 5 and the second elastic filler 6 may be formed integrally, so as to simplify the manufacture process and reduce the manufacture cost.

Figure 9:
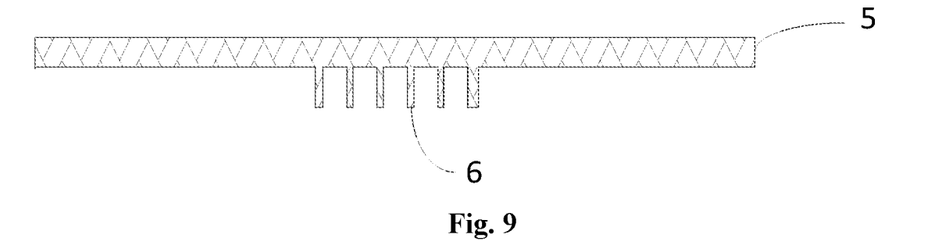
FIG. 9 is a schematic view showing a flat connection layer and an elastic filler according to some embodiments of the present disclosure.

In the embodiments of the present disclosure, the flat connection layer 5 and the second elastic filler 6 may each be made of TPU rubber through a hot-pressing process, so they may be easily deformable and restorable. Through the second elastic filler 6 arranged in each concave portion 122 of the hinge structure, it is able to prevent the adhesive layer from moving into the concave portions or being broken, thereby to provide the adhesion in a better manner. In addition, the TPU rubber may provide excellent buffering and shock-resistant performance.

It should be appreciated that, the hinge structure may include the plurality of convex portions 121 and the plurality of concave portions 122 arranged alternately, and each concave portion 122 may be a groove or a straight slot. A specific structure of the concave portion 122 may be set according to practical need.

In the embodiments of the present disclosure, the sealant 31, the first adhesive layer 32 and the second adhesive layer 33 may each be made of, but not limited to, an optical acrylic adhesive.

Figure 13:
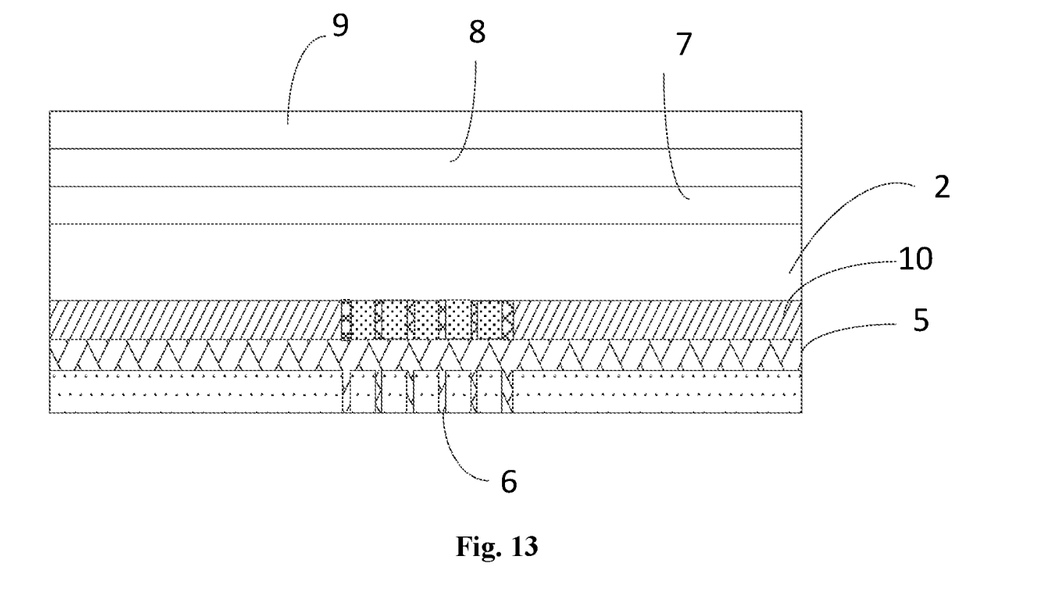
FIG. 13 is still yet another schematic view showing the display device according to some embodiments of the present disclosure.

In the embodiments of the present disclosure, as shown in FIG. 13, a support layer 7 may be further arranged at a surface of the flexible display panel 2 proximate to the body structure 1, and the sealant and the elastic connection structure may be arranged on the support layer 7.

In the embodiments of the present disclosure, the support layer 7 may be a polyimide (PI) film, or may be made of PI and steel use stainless (SUS) (e.g., being a metallic support sheet, especially a stainless steel support sheet), but the present disclosure is not limited thereto.

In the embodiments of the present disclosure, as shown in FIG. 13, a touch layer 8 may be further arranged at a surface of the flexible display panel 2 distal to the body structure 1. Through the touch layer 8, it is able to provide a touch function.

In the embodiments of the present disclosure, as shown in FIG. 13, a protection film layer 9 may be further arranged on the touch layer 8, so as to protect the touch layer 8, and prevent the touch sensitivity from being adversely affected when the touch layer 8 has been damaged.

The display device may be any product or member having a display function, e.g., television, display, digital photo frame, mobile phone or flat-panel computer. The display device may further include a flexible circuit board, a printed circuit board and a back plate.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising a body structure, a flexible display panel arranged on the body structure, a primary adhesive layer, and an elastic connection structure,
   wherein the body structure comprises at least two unfoldable portions and a first foldable portion between the two adjacent unfoldable portions, and the first foldable portion comprises a hinge structure;
   the primary adhesive layer is arranged between the flexible display panel and the unfoldable portions, and the elastic connection structure is arranged between the body structure and the flexible display panel, and the elastic connection structure is configured to enable a second foldable portion of the flexible display panel to be switched between a folded state and a flattened state;
   the hinge structure comprises a plurality of convex portions and a plurality of concave portions arranged alternately, the elastic connection structure comprises:
   a first adhesive layer arranged between the convex portion and the second foldable portion, and a thickness of the first adhesive layer is identical to a thickness of the primary adhesive layer;
   a second adhesive layer arranged between the concave portion and the second foldable portion, wherein a thickness of the second adhesive layer is identical to a thickness of the primary adhesive layer;
   a first elastic filler filled in the concave portion.

2. The display device according to claim 1, wherein in the flattened state, an orthogonal projection of the hinge structure onto a surface of the flexible display panel distal to the hinge structure falls within an orthogonal projection of the second foldable portion onto the surface of the flexible display panel distal to the hinge structure.

3. The display device according to claim 1, wherein a material of the first adhesive layer is identical to a material of the primary adhesive layer.

4. The display device according to claim 1, wherein a surface of the first adhesive layer distal to the body structure is flush with a surface of the primary adhesive layer distal to the body structure, and a surface of the first adhesive layer distal to the flexible display panel is flush with a surface of the primary adhesive layer distal to the flexible display panel.

5. The display device according to claim 1, wherein the first adhesive layer, the second adhesive layer and the primary adhesive layer are made of a same material.

6. The display device according to claim 5, wherein the first adhesive layer, the second adhesive layer and the primary adhesive layer are made of an optical acrylic adhesive.

7. The display device according to claim 1, wherein a surface of the first adhesive layer distal to the body structure, a surface of the second adhesive layer distal to the body structure and a surface of the primary adhesive layer distal to the body structure are flush with each other, and a surface of the first adhesive layer distal to the flexible display panel, a surface of the second adhesive layer distal to the flexible display panel and a surface of the primary adhesive layer distal to the flexible display panel are flush with each other.

8. The display device according to claim 1, wherein the first elastic filler is made of thermoplastic polyurethane rubber.

9. The display device according to claim 1, wherein a support layer is further arranged on a surface of the flexible display panel proximate to the body structure, and the primary adhesive layer and the elastic connection structure are arranged on the support layer.

10. The display device according to claim 1, wherein a touch layer is further arranged on a surface of the flexible display panel distal to the body structure.

11. The display device according to claim 1, wherein
   in the folded state, a surface of the second foldable portion distal to the hinge structure is a curved surface; and
   in the flattened state, the surface of the second foldable portion distal to the hinge structure is a flat surface.

12. The display device according to claim 1, wherein the primary adhesive layer is made of a sealant.

\* \* \* \* \*